(12) United States Patent
Matayabas, Jr.

(10) Patent No.: US 8,901,716 B2
(45) Date of Patent: Dec. 2, 2014

(54) DIELECTRIC FILM WITH LOW COEFFICIENT OF THERMAL EXPANSION (CTE) USING LIQUID CRYSTALLINE RESIN

(75) Inventor: James C. Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 411 days.

(21) Appl. No.: 12/774,681

(22) Filed: May 5, 2010

(65) Prior Publication Data

US 2010/0213581 A1 Aug. 26, 2010

Related U.S. Application Data

(62) Division of application No. 10/876,508, filed on Jun. 25, 2004, now Pat. No. 7,744,802.

(51) Int. Cl.
| | | |
|---|---|---|
| *H01L 23/58* | (2006.01) | |
| *H05B 6/00* | (2006.01) | |
| *H01L 23/532* | (2006.01) | |
| *H01L 21/768* | (2006.01) | |
| *H05K 3/46* | (2006.01) | |
| *B29C 47/00* | (2006.01) | |
| *B29C 45/14* | (2006.01) | |
| *B29D 7/00* | (2006.01) | |
| *H01L 21/56* | (2006.01) | |

(52) U.S. Cl.
CPC .... H01L 23/53295 (2013.01); *H05K 2203/104* (2013.01); *H05K 2201/0141* (2013.01); *H01L 21/563* (2013.01); *H01L 2924/0002* (2013.01); H01L 23/5329 (2013.01); H01L 21/76828 (2013.01); *H05K 2201/068* (2013.01); H05K 3/4626 (2013.01)

USPC ......... 257/642; 257/632; 257/633; 257/501; 257/506; 257/524; 257/E29.018; 257/E29.02; 257/E29.015; 257/E21.01; 264/435; 264/436; 264/108; 264/212; 264/234; 264/250; 264/259; 264/263; 156/242

(58) Field of Classification Search
None
See application file for complete search history.

(56) References Cited

U.S. PATENT DOCUMENTS

| | | | | | |
|---|---|---|---|---|---|
| 4,227,907 | A | * | 10/1980 | Merritt | 65/392 |
| 5,085,807 | A | * | 2/1992 | Okamoto et al. | 252/609 |
| 5,529,741 | A | * | 6/1996 | Rubin et al. | 264/435 |
| 5,882,741 | A | * | 3/1999 | Rubin et al. | 428/1.33 |
| 6,320,257 | B1 | * | 11/2001 | Jayaraj et al. | 257/723 |
| 6,334,922 | B1 | * | 1/2002 | Tanaka et al. | 156/234 |
| 6,339,191 | B1 | * | 1/2002 | Crane et al. | 174/551 |
| 6,663,946 | B2 | * | 12/2003 | Seri et al. | 428/209 |
| 6,764,748 | B1 | * | 7/2004 | Farquhar et al. | 428/209 |
| 6,826,830 | B2 | * | 12/2004 | Egitto et al. | 29/852 |

(Continued)

OTHER PUBLICATIONS

Wang et al., Liquid crystal polymer (LCP) for MEMS: processes and applications, May 2013, J. Journal of Micromechanics and Microengineering, 13 (2003), pp. 628-633.*

*Primary Examiner* — Jeffrey Wollschlager
(74) *Attorney, Agent, or Firm* — Blakely, Sokoloff, Taylor & Zafman LLP

(57) ABSTRACT

An embodiment of the present invention is a technique to provide a dielectric film material with controllable coefficient of thermal expansion (CTE). A first compound containing a first liquid crystalline component is formed. The first compound is cast into a first film. The first film is oriented in an magnetic or electromagnetic field in a first direction. The first film is cured at a first temperature.

18 Claims, 5 Drawing Sheets

(56) References Cited

U.S. PATENT DOCUMENTS

| | | | |
|---|---|---|---|
| 8,221,885 B2* | 7/2012 | Miller | 428/412 |
| 2001/0009102 A1* | 7/2001 | Oh et al. | 65/17.2 |
| 2003/0026574 A1* | 2/2003 | Suzuki et al. | 385/129 |
| 2004/0007774 A1* | 1/2004 | Crane et al. | 257/723 |
| 2004/0056233 A1* | 3/2004 | Samuels et al. | 252/299.01 |
| 2004/0089470 A1* | 5/2004 | Shimoto et al. | 174/250 |
| 2004/0124405 A1* | 7/2004 | Sethumadhavan et al. | 257/1 |
| 2004/0240804 A1* | 12/2004 | Mahapatra et al. | 385/94 |
| 2005/0072461 A1* | 4/2005 | Kuchinski et al. | 136/256 |
| 2005/0272845 A1* | 12/2005 | Miller | 524/430 |
| 2005/0287699 A1* | 12/2005 | Brauer | 438/106 |
| 2013/0257304 A1* | 10/2013 | Takahashi et al. | 315/206 |

* cited by examiner

DIELECTRIC FILM WITH LOW COEFFICIENT OF THERMAL EXPANSION (CTE) USING LIQUID CRYSTALLINE RESIN

BACKGROUND

1. Field of the Invention

Embodiments of the invention relate to the field of semiconductor, and more specifically, to semiconductor materials.

2. Description of Related Art

The next generation die interlayer dielectric (ILD) materials are porous and have poor mechanical strength. To reduce the stresses on the ILD due to coefficient of thermal expansion (CTE) mismatches between materials in the package, low CTE materials are needed. In addition, due to the need for materials to flow over greater distances through narrower gaps, there is a need to eliminate, or minimize the concentration of, the filler, which is typically used to reduce the CTE.

Existing techniques to reduce the CTE and at the same time reduce or eliminate the concentration of the filler has a number of disadvantages. One technique increases the cross-link density and/or increases the filler loading of the dielectric material. This technique leads to high modulus and high viscosity, resulting in cohesive and adhesive failure modes.

BRIEF DESCRIPTION OF THE DRAWINGS

Embodiments of the invention may best be understood by referring to the following description and accompanying drawings that are used to illustrate embodiments of the invention. In the drawings.

DESCRIPTION

An embodiment of the present invention is a technique to provide a dielectric film material with controllable coefficient of thermal expansion (CTE). A first compound containing a first liquid crystalline component is formed. The first compound is cast into a first film. The first film is oriented in an magnetic or electromagnetic field in a first direction. The first film is cured at a first temperature.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the invention is to provide a dielectric material with controllable coefficient of thermal expansion (CTE). The CTE may be controlled to be from a small negative value to over 100 ppm/° C. by controlling (1) the amount of liquid crystal resin in the formulation, and (2) the extent to which the liquid crystalline resin is oriented. The material technology addresses the current low CTE need and may be scalable to future packages with ultra low CTE requirements. In addition, since the elastic modulus of a liquid crystal resin is much reduced in angles other than perpendicular to the direction of orientation, the dielectric film exhibits low modulus in the z-direction to become resilient with respect to mechanical stability problems caused by package motion.

One embodiment of the invention provides dielectric materials that are useful for a number of applications. Examples of these applications include: (1) traditional substrate build-up processes involving copper plating, photo resist lamination, exposure, development, etching, and resist removal, (2) photo definable dielectric films (without the use of a photo resist), (3) printed circuit board (PCB) fabrication and (4) imprinting.

Figure 1A:
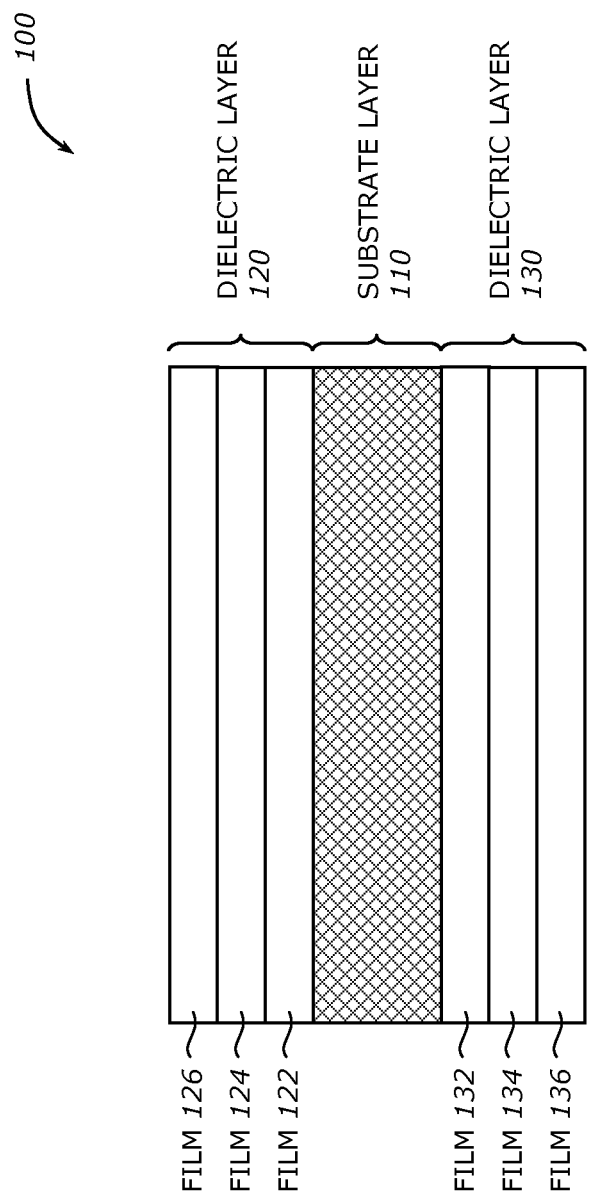
FIG. 1A is a diagram illustrating a semiconductor device in which one embodiment of the invention can be practiced.

FIG. 1A is a diagram illustrating a semiconductor device 100 in which one embodiment of the invention can be practiced. The semiconductor device 100 includes a substrate layer 110 and two dielectric layers 120 and 130.

The substrate layer 110 is any suitable semiconductor substrate such as silicon. During the fabrication process, device elements such as field oxides, sources and drains are formed on the substrate.

The dielectric layer 120 is deposited on the substrate layer 110. Other layers such as metal interconnect, gates may be deposited as part of a typical semiconductor fabrication process. The dielectric layer 120 may include a single film or multiple films. As illustrated in FIG. 1A, three films 122, 124, and 126 form the dielectric layer 120. Each of the films 122, 124, and 126 may have a different CTE at a selected magnetic field direction.

The dielectric layer 130 is formed below the surface of the substrate layer 110. It may be optional and may provide additional protection or other functionalities Like the dielectric layer 120, the dielectric layer 130 may include a single film or multiple films. As illustrated in FIG. 1, it includes three films 132, 134, and 136 Like in the dielectric layer 120, each of the films 132, 134, and 136 may have a different CTE at a selected magnetic field direction.

Figure 2:
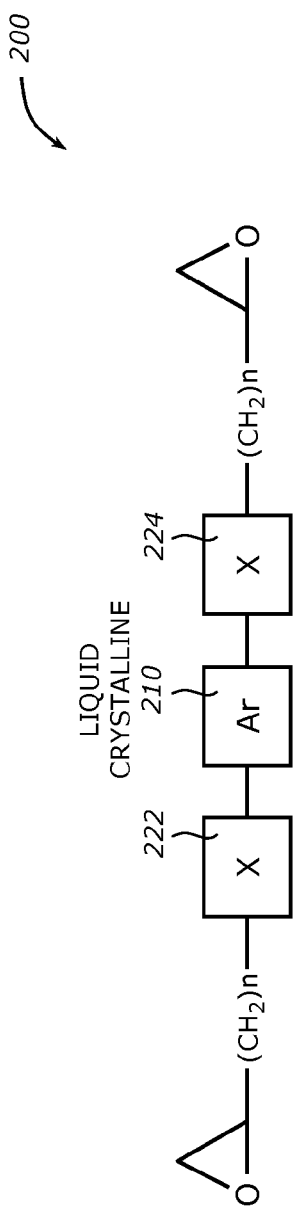
FIG. 2 is a diagram illustrating a structure of the dielectric material according to one embodiment of the invention.
Figure 3:
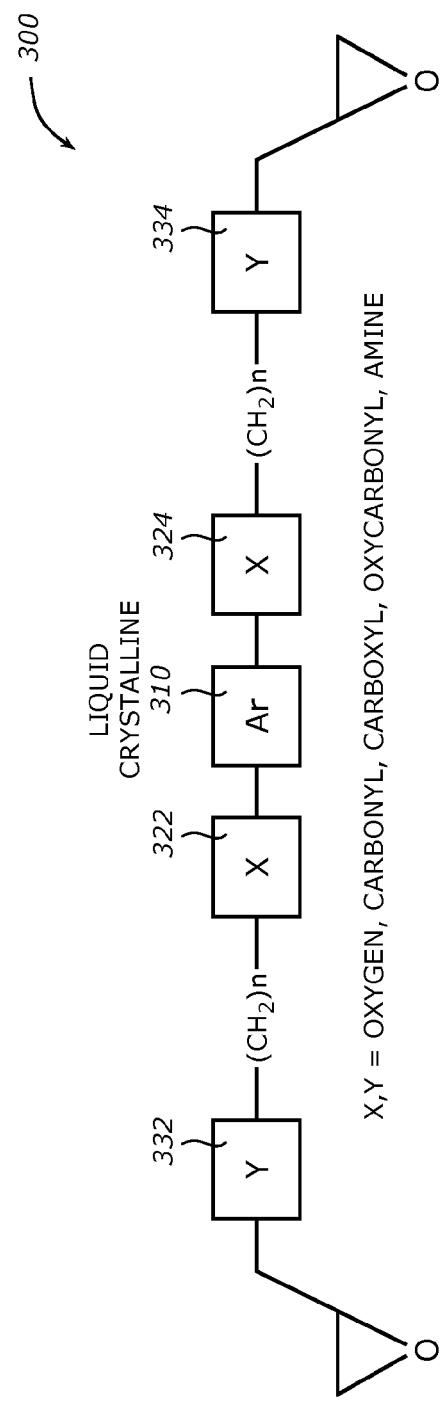
FIG. 3 is a diagram illustrating another structure of the dielectric material according to one embodiment of the invention.

Any one of the dielectric layers 120 and 130 is constructed according to one embodiment of the invention to have controllable CTE. The CTE may be provided with low values. The multiple films in each of the layers 120 and 130 are oriented in different directions in a magnetic or electromagnetic field with suitable magnetic strength, time, temperature, and orientation of the magnetic field. By selecting proper values for the magnetic field strength, time, temperature, and orientation, controllable CTE values may be achieved. The film is formed by a compound or material that comprises monomers having a general structure as shown in FIGS. 2 and 3.

Figure 1B:
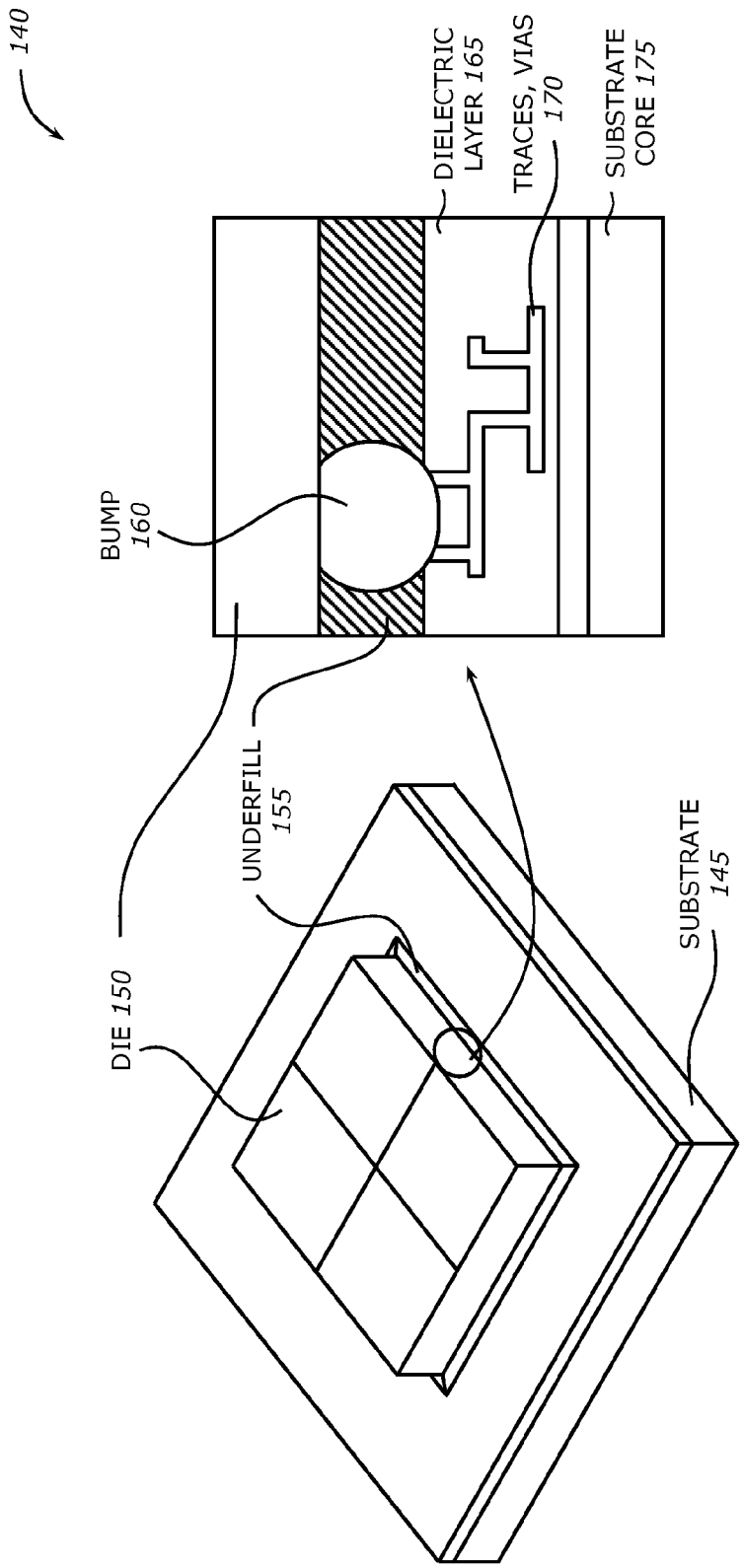
FIG. 1B is a diagram illustrating a semiconductor package according to one embodiment of the invention.

FIG. 1B is a diagram illustrating a semiconductor package 140 according to one embodiment of the invention. The package 140 is a flip chip package. However, it is contemplated that any other type of package may also be used. The package 140 includes a package substrate 145 and a die 150.

The package substrate 145 is any suitable package substrate, ceramic or organic, such as standard FR4, high graded epoxy (e.g., bismaleimide triazine) and flexible circuit substrate. The package substrate 145 typically has a low coefficient of thermal expansion (CTE). The die 150 is any semiconductor die. It includes an integrated circuit (e.g., processor, memory), a device, components, etc. The underfill 155 is an adhesive to join the entire surface of the chip to the substrate. It is typically an epoxy.

The die 150 has bumps 160. Any suitable type of bumps may be used such as Controlled Collapse Chip Connection (C4), plated bumps, stud bumps, etc. The bumps 160 provide electrically and thermally conductive paths to the substrate 145. They also serve to provide part of the mechanical mounting of the die to the substrate 145 and act as a short lead to relieve the mechanical strain between the substrate and the board.

The substrate 145 includes a dielectric layer 165, traces and vias 170, and a substrate core 175. The dielectric layer 165 has a controllable CTE to match with the substrate core 175 provided by one embodiment of the invention. The traces and vias 170 provide contacts and electrical paths to the substrate. The substrate core 175 may be made of any suitable material such as epoxy.

FIG. 2 is a diagram illustrating a structure 200 of the dielectric material according to one embodiment of the invention.

The structure 200 includes a liquid crystalline segment 210, two elements X 222 and 224, and $(CH_2)n$. The liquid crystalline segment 210 is a rod-like liquid crystalline component. Each of the two elements X's 222 and 224 is independently selected from a group of oxygen, carbonyl, carboxyl, oxycarbonyl, and amine. The integer n in $(CH_2)n$ is between 1 and 20. The monomer formed by the structure 200 has a melting point of below approximately 200° C.

FIG. 3 is a diagram illustrating another structure 300 of the dielectric material according to one embodiment of the invention.

The structure 300 includes a liquid crystalline segment 310, two elements X 322 and 324, $(CH_2)n$, and two elements Y's 332 and 334. The liquid crystalline segment 310 is a rod-like liquid crystalline component. Each of the two elements X's and Y's 322, 324, 332, and 334 is independently selected from a group of oxygen, carbonyl, carboxyl, oxycarbonyl, and amine. The integer n in $(CH_2)n$ is between 2 and 20. The monomer formed by the structure 300 also has a melting point of below approximately 200° C.

The dielectric materials formed by the structures 200 and 300 may also be added with additives such as solvents, one or more catalysts, one or more fillers, and other additives such as adhesion promoters, mold release agents, colorants, stabilizers, flame retardants, and the like additives as known by one skilled in the art.

In one embodiment of the invention, the dielectric material as formed above is cast into a film and oriented by a magnetic or electromagnetic field, and then used to prepare as substrate. It is also useful to employ a solvent as diluent to aid film formation and orientation of the liquid crystal resin.

In another embodiment of the invention, the dielectric material is cast into a film, laminated onto a substrate, oriented by a magnetic or electromagnetic field while curing at elevated temperature, typically above the melting point of the resin, and then used to prepare a substrate. The magnetic or electromagnetic orientation of the dielectric film may be conducted on the cast film, prior to drying any solvent used, and during cure. The extent of liquid crystal resin orientation, which affects the CTE properties, is controlled by the magnetic or electromagnetic strength, time, temperature, and orientation of the magnetic or electromagnetic field.

The dielectric layer may also include a number of dielectric films as shown in FIG. 1. The dielectric films include the liquid crystal resin formed as above with different orientation directions and/or to different extents to provide desired two or three-dimensional properties. For example, three films may be used and oriented in the x-direction, the y-direction, and the z-direction.

Figure 4:
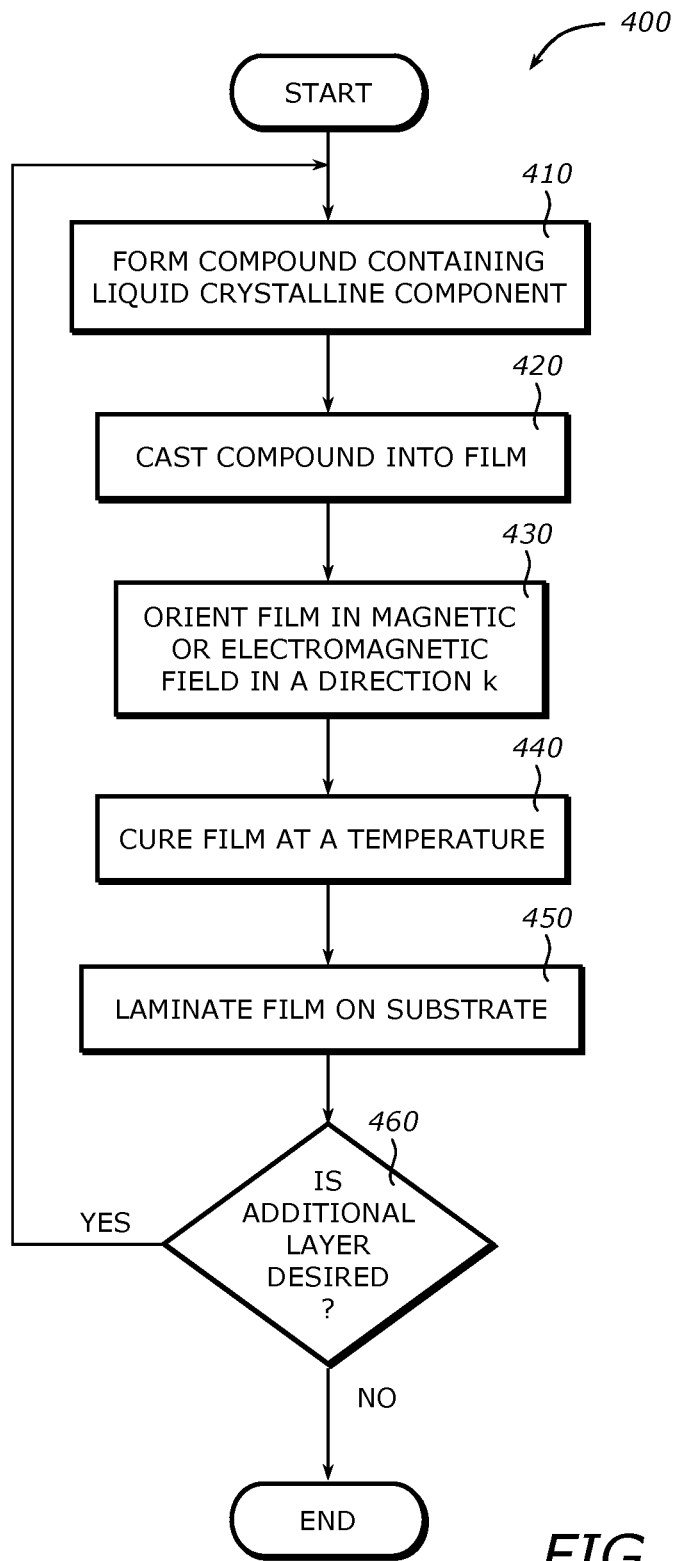
FIG. 4 is a flowchart illustrating a process to provide the dielectric layer according to one embodiment of the invention.

FIG. 4 is a diagram illustrating a process 400 to provide the dielectric layer according to one embodiment of the invention.

Upon START, the process 400 forms a compound containing a liquid crystalline component (Block 410). The compound has the structure as shown in FIGS. 2 and 3. Next, the process 400 casts the compound into a film (Block 420). Then, the process 400 orients the film in a magnetic or electromagnetic field in a direction k (Block 430). The direction k may be the x-direction, the y-direction, or the z-direction as desired.

Next, the process 400 cures the film at a temperature (Block 440). This temperature is typically higher than the melting point of the resin, e.g., above 200° C. Then, the process 400 laminates the film on a substrate or on another film as appropriate (Block 450). Next, the process 400 determines if an additional layer is desired (Block 460). If so, the process 400 goes back to Block 410 to repeat the process with the same or different magnetic strength, time, temperature, and orientation. Otherwise, the process 400 is terminated.

Experiments are conducted to provide quantitative data for the dielectric material described above. The experiments are conducted with and without magnetic or electromagnetic orientation, and with and without fillers. The results confirm that controllable CTE's are achieved in different directions of the orientation.

In the first experiment, a dielectric film is formed without magnetic or electromagnetic orientation. A mixture is formed by 210 parts of methyl ethyl ketone, 20 parts of digylcidyl Bisphenol-A, 20 parts of tetrabromo Bisphenol-A, 20 parts of ortho-cresol novolak epoxy resin (215 g/eq), 15 parts of epoxy-terminated polybutadiene rubber, 50 parts of brominated phenolic novolak resin, 4 parts of 2,4-diamino-6-(2-methyl-1-imadizolylethyl)-1,3,5-triazine.isocyanuric acid adduct, and 11 parts of silica (maximum particle size of 5 microns). These components are added to a planetary mixer, heated to about 80° C., and mixed at 50 revolutions per minute (rpm) for about one hour. The mixture is then passed twice through a 2-roll mill at about 80° C. The above mixture is cast onto 40 micron thick Mylar film and dried at about 100° C. for 15 minutes to provide a total film thickness of about 70 microns. The film is then laminated onto a substrate material by vacuum lamination at about 120° C. and 1 torr. The film is cured at about 170° C. for 2 hours. The dielectric layer thus prepared has CTE of about 65 ppm in the x,y-plane of the film and in the z-direction.

In the second experiment, the procedure described in the first experiment is repeated except that while curing the multilayer structure, a magnetic field of about 0.3 Telsa is applied. The dielectric layer thus prepared has CTE of about 80 ppm in the x,y-plane of the film and about 40 ppm in the z-direction. This experiment shows that the CTE of each film at a different orientation may be controlled to be different. Furthermore, low values of CTE (e.g., 40 ppm) may also be achieved.

In the third experiment, a mixture is formed by 210 parts of methyl ethyl ketone, 60 parts of an epoxy resin B (shown in FIG. 5), 20 parts of ortho-cresol novolak epoxy resin (215 g/eq), 15 parts of epoxy-terminated polybutadiene rubber, 50 parts of brominated phenolic novolak resin, 4 parts of 2,4-diamino-6-(2-methyl-1-imadizolylethyl)-1,3,5-triazine.isocyanuric acid adduct, and 11 parts of silica (maximum particle size of 5 microns). These components are added to a planetary mixer, heated to about 80° C., and mixed at 50 rpm for about 1 hour. The mixture is then passed twice through a 2-roll mill at about 80° C. The above mixture is cast onto 40 micron thick Mylar film. The film is placed into a magnetic field of about 0.3 Telsa in the z-direction for 30 minutes, and then dried at about 100° C. for 15 minutes in the magnetic field to provide a total film thickness of about 70 microns. The film is then laminated onto a substrate material by vacuum lamination at about 120° C. and 1 torr. The film is cured at about 170° C. for 2 hours. The dielectric layer thus prepared has CTE of about 75 ppm in the x,y-plane of the film and about 50 ppm in the z-direction.

In the fourth experiment, the procedure described in the third experiment is repeated except that no fillers are used. The dielectric layer thus prepared has CTE of about 125 ppm in the x,y-plane of the film and about 5 ppm in the z-direction. This experiment illustrates that without fillers, very low CTE values (e.g., 5 ppm) may be achieved at a selected orientation or direction.

Figure 5:
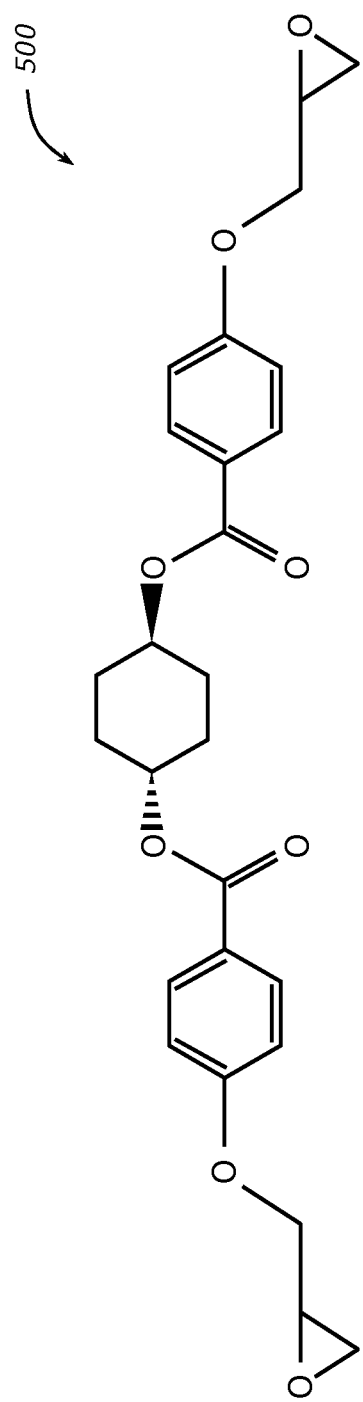
FIG. 5 is a diagram illustrating an epoxy resin according to one embodiment of the invention.

FIG. 5 is a diagram illustrating the epoxy resin B according to one embodiment of the invention. This epoxy resin B is used in the third experiment to produce the mixture.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A semiconductor package comprising:
   a silicon substrate layer;
   a dielectric layer disposed over the silicon substrate layer, the dielectric layer comprising a first film formed from a first compound containing a first liquid crystalline component and a second film formed from a second compound containing a second liquid crystalline component, wherein the first film is oriented in a first direction and the second film is oriented in a second direction the second direction different and not orthogonal to the first direction, wherein the dielectric layer has a coefficient of thermal expansion (CTE) that matches with the CTE of said silicon substrate layer.

2. The semiconductor package of claim 1 wherein the first film comprises: at least an additive added to the compound.

3. The semiconductor package of claim 2 wherein the at least additive comprises:
   one of a catalyst, an adhesive, an adhesion promoter, a mold release agent, a flame retardant, a stabilizer, and a colorant.

4. The semiconductor package of claim 1 wherein the first film further comprises: a filler added to the first compound.

5. The semiconductor package of claim 1 wherein the first film is laminated onto said substrate layer.

6. The semiconductor package of claim 1 wherein the first compound comprises:
   a rod-like liquid crystalline component;
   an element selected from a group of oxygen, carbonyl, carboxyl, oxycarbonyl, and amine; and
   $(CH_2)n$, n being from 1 to 20.

7. The semiconductor package of claim 1 wherein the first compound comprises:
   a rod-like liquid crystalline component;
   first and second elements, each being independently selected from a group of oxygen, carbonyl, carboxyl, oxycarbonyl, and amine; and
   $(CH_2)n$, n being from 2 to 20.

8. The semiconductor package of claim 1 wherein the multilayer is curable at a temperature.

9. The semiconductor package of claim 8 wherein said temperature is above a melting point of one of the first and second compounds.

10. A packaged semiconductor device comprising:
    a semiconductor die;
    a substrate layer; and
    a dielectric layer disposed over the substrate layer said dielectric layer between said semiconductor die and said substrate layer, the dielectric layer comprising:
      a first film formed from a first compound containing a first liquid crystalline component, wherein the first liquid crystal component of the first film is oriented in a first direction, and a second film formed from a second compound comprising a second liquid crystalline component, wherein the second liquid crystal component of the second film is oriented in a second direction the second direction different and not orthogonal to the first direction, the second film being combined with the first film to form a multilayer which produces a coefficient of thermal expansion (CTE) in the dielectric layer that matches a CTE of the substrate layer.

11. The packaged semiconductor device of claim 10 wherein the first film comprises:
    at least an additive added to the compound.

12. The packaged semiconductor device of claim 11 wherein the at least additive comprises:
    one of a catalyst, an adhesive, an adhesion promoter, a mold release agent, a flame retardant, a stabilizer, and a colorant.

13. The packaged semiconductor device of claim 10 wherein the first film further comprises:
    a filler added to the first compound.

14. The packaged semiconductor device of claim 10 wherein the first film is laminated onto the substrate.

15. The packaged semiconductor device of claim 10 wherein the first compound comprises:
    a rod-like liquid crystalline component;
    an element selected from a group of oxygen, carbonyl, carboxyl, oxycarbonyl, and amine; and $(CH_2)n$, n being from 1 to 20.

16. The packaged semiconductor device of claim 10 wherein the first compound comprises:
    a rod-like liquid crystalline component;
    first and second elements, each being independently selected from a group of oxygen, carbonyl, carboxyl, oxycarbonyl, and amine; and
    $(CH_2)n$, n being from 2 to 20.

17. The packaged semiconductor device of claim 10 wherein the multilayer is curable at a temperature.

18. The packaged semiconductor device of claim 17 wherein said temperature is above a melting point of one of the first and second compounds.

* * * * *